United States Patent
Maekawa et al.

(10) Patent No.: US 7,274,038 B2
(45) Date of Patent: Sep. 25, 2007

(54) SILICON NITRIDE FILM, A SEMICONDUCTOR DEVICE, A DISPLAY DEVICE AND A METHOD FOR MANUFACTURING A SILICON NITRIDE FILM

(75) Inventors: Shinji Maekawa, Kanagawa (JP); Tetsuya Kakehata, Kanagawa (JP); Yuuichi Takehara, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 180 days.

(21) Appl. No.: 10/873,285

(22) Filed: Jun. 23, 2004

(65) Prior Publication Data

US 2004/0262613 A1 Dec. 30, 2004

(30) Foreign Application Priority Data

Jun. 30, 2003 (JP) ............................. 2003-189045

(51) Int. Cl.
*H01L 29/04* (2006.01)
*H01L 31/20* (2006.01)
*H01L 31/0376* (2006.01)
*H01L 27/12* (2006.01)

(52) U.S. Cl. ............................. 257/59; 257/57; 257/72; 257/347

(58) Field of Classification Search ............ 257/57, 257/59, 72, 347
See application file for complete search history.

(56) References Cited

U.S. PATENT DOCUMENTS

| 6,274,887 B1 * | 8/2001 | Yamazaki et al. ........... 257/72 |
| 6,414,825 B1 * | 7/2002 | Inoue et al. ............... 360/320 |

FOREIGN PATENT DOCUMENTS

| EP | 1 168 427 A1 | 1/2002 |
| JP | 06-061222 | 3/1994 |
| JP | 09-205209 | 8/1997 |
| JP | 2002-151514 | 5/2002 |

* cited by examiner

*Primary Examiner*—Sara Crane
*Assistant Examiner*—Samuel A. Gebremariam
(74) *Attorney, Agent, or Firm*—Fish & Richardson P.C.

(57) ABSTRACT

The present invention provides a method for forming by plasma CVD a silicon nitride film that can be formed over heat-sensitive elements as well as an electroluminescent element and that has favorable barrier characteristics. Further, the present invention also provides a semiconductor device, a display device and a light-emitting display device formed by using the silicon nitride film. In the method for forming a silicon nitride film by plasma CVD, silane ($SiH_4$), nitrogen ($N_2$) and a rare gas are introduced into a deposition chamber in depositing, and the reaction pressure is within the range from 0.01 Torr to 0.1 Torr.

28 Claims, 6 Drawing Sheets

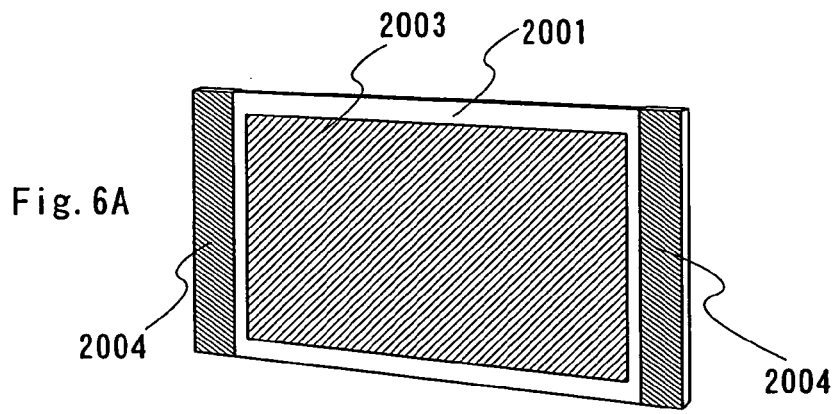
Fig. 6A
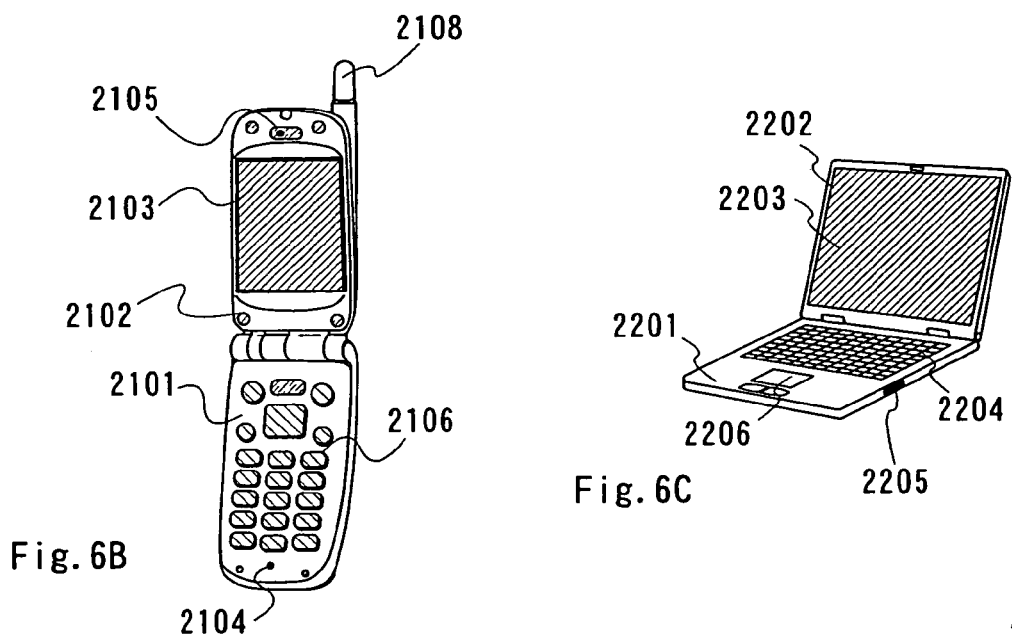
Fig. 6B
Fig. 6C
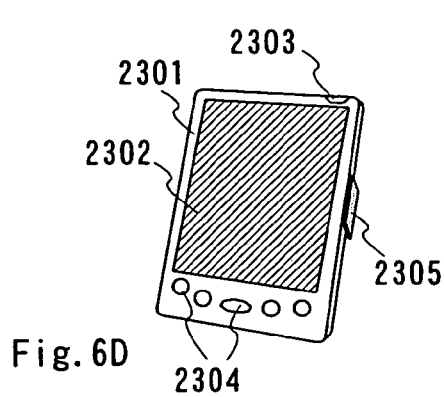
Fig. 6D
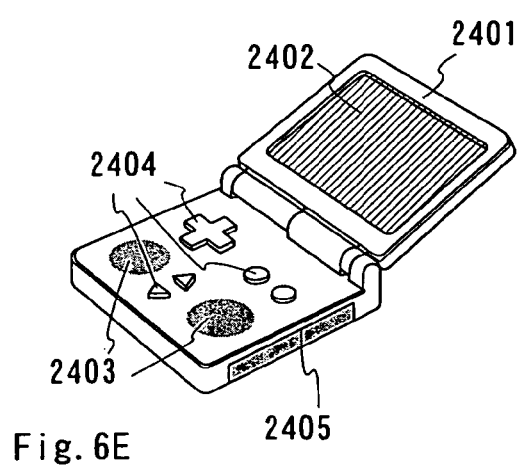
Fig. 6E

SILICON NITRIDE FILM, A SEMICONDUCTOR DEVICE, A DISPLAY DEVICE AND A METHOD FOR MANUFACTURING A SILICON NITRIDE FILM

BACKGROUND OF THE INVENTION

1. Field of the Invention

The present invention relates to a silicon nitride film and a manufacturing method thereof and specifically, to a high quality silicon nitride film and a method for manufacturing the same with comparatively cold temperature. Further, the present invention relates to a semiconductor device that is superior in reliability.

2. Description of the Related Art

There are various electronic device products with technical progress in the world. Conditions required for these products become severe year by year, and long-term reliability is taken for granted as well as enhancing style and performance.

Various elements such as pixels and semiconductor elements are used for such electronic devices, but there are some devices which tend to deteriorate by being exposed to an atmospheric component (such as water or oxygen).

Deterioration of elements forming an electronic device decreases the reliability of the electronic device in itself. Thus, the above described elements which easily deteriorate are often given with protective measures.

There are methods for filling an atmosphere to which an element is exposed, with an inert gas or providing it with a desiccant, as typical protective measures.

In addition, there is a measure that an element that easily deteriorates is covered with a material that does not easily transmit such deterioration factors. As the materials, silicon nitride, silicon oxide, silicon nitride oxide, carbon nitride, carbon are cited. A film made of the materials has barrier characteristics against a particular gas and thus, serves effectively as a protective film for an element.

It is known that silicon nitride has barrier characteristics against moisture or oxygen but the degree is different according to film formation conditions. In general, silicon nitride is denser and has better barrier characteristics, as the etching rate of a particular etching solution is smaller. Further, variation of barrier characteristics is thought to be related to variation of film composition depending on film formation conditions.

By the way, an electroluminescent (EL) element is given as example of the element in which deterioration is promoted by a substance penetrating from the outside like this. Since an electroluminescent element uses an organic material or a combination material of an inorganic material and an organic material as an electroluminescent layer, the electroluminescent element easily deteriorates due to moisture or oxygen.

The electroluminescent element is mainly expected to be applied to displays and the like. However, as the result of deterioration of an electroluminescent element due to oxygen or moisture, generation of a dark spot or progress of a shrinkage is accelerated and the element lacks the reliability as a product and is difficult to practically use. Thus, it is extremely necessary to protect an electroluminescent element from moisture or oxygen and to enhance the reliability.

There is a method for manufacturing a silicon nitride film containing less hydrogen for preventing deterioration of an element due to moisture or oxygen, and the like (Reference: Japanese Patent Laid-Open No. H 9-205209).

A barrier film made of a silicon nitride film that does not easily penetrate moisture or oxygen is preferably formed for such an electroluminescent element. Although there are various methods for forming a protective film, plasma CVD is preferably employed since the plasma CVD can give good productivity and coverage.

The barrier film is, however, formed as a top layer, and thus, needs to be formed at the heat-resistance temperature or less of elements formed under the barrier film. For example, when an interlayer insulating film is made of acrylic, the permissible temperature is 100° C. or less in view of problems such as degasification. Naturally, it is not preferable that an EL element is heated at higher temperature than necessary.

However, for forming a silicon nitride film having enough barrier characteristics by a conventional plasma CVD, a substrate is needed to be heated at the temperatures from 300° C. to 400° C., thus, it is difficult to apply the plasma CVD to heat-sensitive elements.

SUMMARY OF THE INVENTION

It is an object of the present invention to provide a method for forming by plasma CVD a silicon nitride film that can be formed over heat-sensitive elements as well as an EL element and that has favorable barrier characteristics.

Further, it is another object of the present invention to provide a semiconductor device, a display device and a light-emitting display device formed by using the silicon nitride film.

In order to achieve the objects, a method for forming a silicon nitride film by plasma CVD according to the present invention is a method by which silane ($SiH_4$), nitrogen ($N_2$) and a rare gas are introduced into a deposition chamber in depositing, and the reaction pressure is within the range from 0.01 Torr to 0.1 Torr.

Another structure of the present invention is that the flow-rate ratio of the $SiH_4$ gas to the $N_2$ gas and a rare gas ($SiH_4/N_2$ and rare gas) is 0.002 or more and less than 0.006 in the above structure.

Another structure of the present invention is that the reaction temperature is within the temperatures from 60° C. or more to less than 85° C. in the above structure.

Another structure of the present invention is that the rare gas is any one of helium (He), neon (Ne), argon (Ar), krypton (Kr), and xenon (Xe) in the above structure.

A silicon nitride film that can achieve the objects comprises a rare gas element of 0.3 atomic % or more; and characteristics that etching rate on a buffered hydrogen fluoride including HF of 4.7% and $NH_4F$ of 36.3% at room temperature (20-25° C.) is 30.0 nm/min or less.

Another structure is that a silicon nitride film that can achieve the objects comprises a rare gas element of 0.3 atomic % or more; hydrogen of less than 25 atomic %; and characteristics that etching rate on a buffered hydrogen fluoride including HF of 4.7% and $NH_4F$ of 36.3% at room temperature is 30.0 nm/min or less.

Another structure is that a silicon nitride film that can achieve the objects comprises a rare gas element of 0.3 atomic % or more; oxygen of 4.0 atomic % or more; and characteristics that etching rate on a buffered hydrogen fluoride including HF of 4.7% and $NH_4F$ of 36.3% at room temperature is 30.0 nm/min or less.

Another structure is that a silicon nitride film that can achieve the objects comprises a rare gas element of 0.3 atomic % or more; oxygen of 4.0 atomic % or more; hydrogen of less than 25 atomic %; and characteristics that etching rate on a buffered hydrogen fluoride including HF of 4.7% and NH$_4$F of 36.3% at room temperature is 30.0 nm/min or less.

Another preferable structure is that a silicon nitride film that can achieve the objects comprises characteristics that etching rate is 20.0 nm/min or less in the above described structure.

Another preferable structure of a silicon nitride film is that the hydrogen concentration is less than 20 atomic % in the above described structure.

Another preferable structure of a silicon nitride film is that the oxygen concentration is 4.0 atomic % or more and less than 10 atomic % in the above described structure.

A structure of the present invention that can achieve the objects is that a semiconductor device comprises the silicon nitride film.

A structure of the present invention that can achieve the objects is that a display device comprises the silicon nitride film.

A structure of the present invention that can achieve the objects is that a light emitting display device comprises the silicon nitride film.

According to the present invention, a dense silicon nitride film having good barrier characteristics can be manufactured at a low temperature.

In even a heat-sensitive element, penetration of moisture or oxygen can be prevented effectively by using a silicon nitride film of the present invention as a barrier film without deterioration due to heat. Further, not only reliability of an element but also reliability of a semiconductor device, a display device, a light-emitting display device or an electronic device that incorporates the element can be enhanced.

These and other objects, features and advantages of the present invention become more apparent upon reading of the following detailed description along with the accompanying drawings.

BRIEF DESCRIPTION OF THE DRAWINGS

In the accompanying drawings:

FIGS. 6A to 6E each show an example of electronic devices according to the present invention.

DETAILED DESCRIPTION OF THE INVENTION

Embodiment Modes

Embodiment Mode 1

A method for manufacturing a dense silicon nitride film by plasma CVD under conditions of substrate temperature of 80° C. is described hereinafter. When the substrate temperature is too low, quality of plasma becomes bad and thus, a favorable film cannot be formed. On the contrary, when the substrate temperature is too high, an element formed below the film deteriorates. Consequently, the substrate temperature is preferably within the range from 60° C. to 85° C. 80° C. is favorable, since the element below the film is less damaged and a favorable plasma state can be obtained, when the substrate temperature is set to 80° C.

Figure 1:
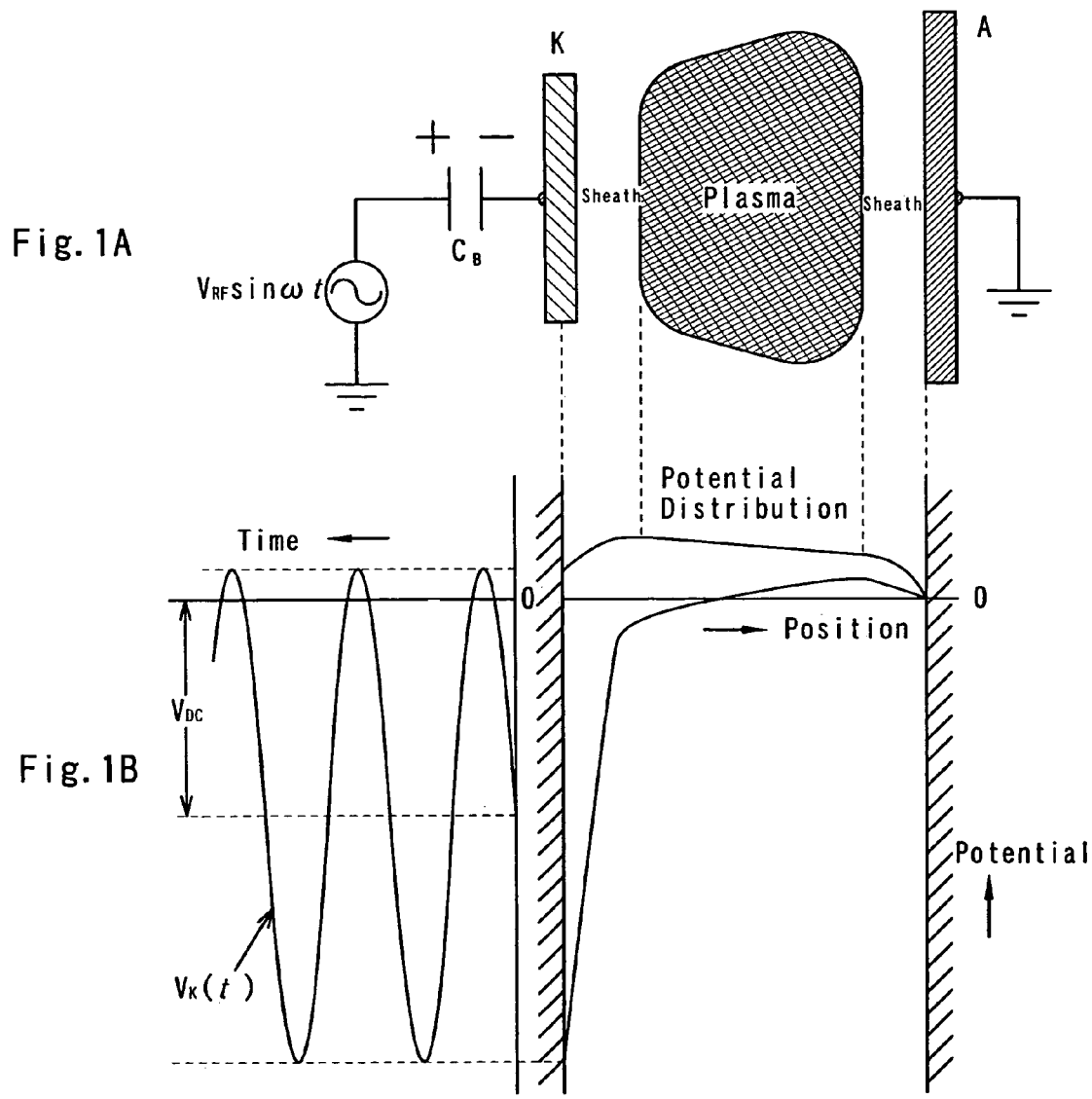
FIGS. 1A and 1B are conceptual views of a CVD apparatus of the present invention.

FIG. 1A is a conceptual diagram of a plasma CVD apparatus used in this embodiment mode. An RF plasma CVD of 13.56 MHz is employed in this embodiment mode and a sheath is formed on the plasma side of each electrode to generate self-bias voltage as shown in FIG. 1B. In this embodiment mode, a substrate is installed on an electrode A side to form a film.

Silane (SiH$_4$), nitrogen (N$_2$) and a rare gas are used as deposition gases in the present invention. Argon (Ar) is used as the rare gas in this embodiment mode. The gas flow rate of SiH$_4$: N$_2$: Ar is 2:300:500 [sccm]. It is one feature of the present invention to use a rare gas. As shown in Table 1, most of rare gases such as Ar and He can generate stable plasma even with low energy, since they show low voltage in starting discharging.

TABLE 1

| | Gas | | | |
|---|---|---|---|---|
| | He | Ar | N$_2$ | O$_2$ |
| Discharge Voltage (kV/cm) | 3.7 | 6.7 | 35.4 | 27.1 |
| Metastable State Energy (eV) | 20.61 | 11.72 | 6.17 | 1.63 |
| Metastable State Life (sec) | 6 × 10$^5$ | more than 1.3 | 2 | 7 |
| Diffusion Coefficient (cm$^2$ · s$^{-1}$ · Torr) | 400~600 | 49 | 146 | — |
| Ionization Energy (eV) | 24.58 | 15.76 | 15.5 | 12.1 |

As apparent from helium (He) shown in Table 1, energy in starting discharging of rare gases is generally low and thus, stable plasma can be obtained. Rare gases such as helium (He), neon (Ne), krypton (Kr), and xenon (Xe) can be adopted in addition to argon (Ar). The gases are each an inert gas and thus, does not influence a chemical reaction for forming silicon nitride.

By the way, it is known that plasma generated by the rare gases has a positive electric charge and is accelerated by a sheath to collide against the electrode. This is called an ion bombardment. When this ion bombardment is used positively, it is thought to be efficient that a substrate is set on the electrode K side on which potential difference with a plasma region is large. (FIG. 1B)

On the contrary, when an effect of the ion bombardment is used, the substrate is not set commonly on the electrode A side in which a potential difference with the plasma region is small. However, the substrate is daringly formed on the electrode A side in which the potential difference with the plasma region is small, according to the present invention. This is because deposition is promoted by giving moderate ion bombardment and a dense film having an improved film quality is formed.

Referentially the etching rate of a silicon nitride film formed when argon gas is not introduced in the same structure as above is about 55 nm/min. However, the etching rate when Ar is introduced is about 28 nm/min. Thus, a dense film whose etching rate becomes about twice as slow as the above described rate is obtained by an effect of rare gas.

Other conditions are shown in Table 2.

TABLE 2

| Substrate | Substrate Temperature | Deposition Pressure | RF Power | Substrate Position |
|---|---|---|---|---|
| Glass | 80° C. | 0.1 Torr | 13.56 MHz 300 W | Gap 30 mm |

Although the silicon nitride film is formed at cold temperature of 80° C. in the above conditions, the etching rate (room temperature: 20-25° C.) in buffered hydrogen fluoride including HF of 4.7% and NH$_4$F of 36.3% (made by Morita Chemical Industries Co., Ltd, 110—Buffered Hydrogen Fluoride) is 29.59 nm/min, and the etching rate (room temperature) in LAL500 (made by Stella Chemifa Corporation) is 30.19 nm/min. As a result, a dense film that is favorable in quality is obtained.

In this manner, a method of the present invention makes it possible to obtain a silicon nitride film which shows the etching rate as described above and which has favorable barrier characteristics.

Then, composition of the silicon nitride film of the present invention formed under the above conditions is shown in Table 3. Composition of a silicon nitride film formed at the normal temperature (substrate temperature of 325° C.) under the condition of not employing Ar is shown in Table 4 as a comparative example. It should be noted that about the amount of hydrogen, although difference in SIMS data is not seen so much, no less than 10% difference is shown in RBS data. It is thought that the reason is that the amount of hydrogen is close to detection saturation in SIMS measurement.

TABLE 3

| Concentration | Hydrogen | Nitrogen | Oxygen | Argon | Density (atom/cm$^3$) |
|---|---|---|---|---|---|
| SIMS (atoms/cm$^3$) | $1.3 \times 10^{22}$ | Detection Saturation | $7.1 \times 10^{21}$ | $3.6 \times 10^{20}$ | $1.10 \times 10^{23}$ |
| RBS (atomic %) | 15 | 46.7 | 7.2 | 0.3 | |

TABLE 4

| Concentration | Hydrogen | Nitrogen | Oxygen | Argon | Density (atom/cm$^3$) |
|---|---|---|---|---|---|
| SIMS (atoms/cm$^3$) | $1.0 \times 10^{22}$ | Detection Saturation | $3.0 \times 10^{17}$ | Less than the Minimum Limit of Detection | $1.11 \times 10^{23}$ |
| RBS (atomic %) | 25 | 44 | — | — | |

Flow Rate: SiH4:NH3:N2:H2 = 30:240:300:60[SCCM]
Pressure: 1.20 Torr
RF power: 13.56 MHz 150 W In addition, the etching rate of the silicon nitride film of the comparative example is 35.0 nm/min in the room temperature in the LAL500 (made by Stella Chemifa Corporation). The etching rate in the LAL500 of the silicon nitride of the present invention is 30.19 nm/min in the room temperature. As the result thereof, it is apparent that the silicon nitride film of the present invention is as dense and favorable in quality as or denser and more favorable in quality than the silicon nitride film of the comparative example, although the silicon nitride film of the present invention is formed at low temperature of 80° C.

A notable point in results (Table 3, Table 4) of these composition analysis is existence of a rare gas (Ar) and oxygen, and the amount of hydrogen in the silicon nitride film of the present invention. The rare gas (Ar) is an essential gas for a method for manufacturing the silicon nitride film of the present invention, and occupies a bigger ratio of the flow-rate ratio. Therefore, a rare gas (Ar) is included in the silicon nitride film of the present invention. A rare gas (Ar) becomes equal to or less than the minimum limit of detection in the conventional silicon nitride film formed without a rare gas (Ar). The rare gas (Ar) concentration in the silicon nitride film of the present invention is 0.3 atomic % in this experimental result, but the concentration of the rare gas (Ar) is at least 0.2 atomic %, preferably within the range from 0.3 atomic % to 0.7 atomic %.

Then, the amount of oxygen is given as characteristic composition. The amount of oxygen of the silicon nitride film of the present invention is comparatively large and it can be also regarded as a silicon oxide film. However, because the measurement result of the refractive index shows a refractive index of a silicon nitride film, it can be said that the film formed by a method for manufacturing of the present invention is a silicon nitride film. Therefore, the silicon nitride film of the present invention can be referred to as a silicon nitride film including much oxygen.

In addition, the film stress of a silicon nitride film is usually tensile stress. However, the film stress of a silicon oxynitride film having the oxygen concentration of about 60 atomic % becomes compressive stress, and as the oxygen concentration in the film becomes higher, it is understood that film stress shows a tendency of compression. On the other hand, the silicon nitride film of the present invention shows an evident tendency of compressive stress. It is thought that this is an influence of oxygen included in the film. The stress becomes compressive stress from tensile stress, and therefore, the silicon nitride film of the present invention is a film which has favorable adhesiveness and which is hard to peel.

The oxygen concentration in the silicon nitride film of the present invention is 2 atomic % or more, and when it is from 2 atomic %, to 10 atomic %, preferably from 2 atomic % to 8 atomic %, better characteristics can be obtained.

Lastly, as for the amount of hydrogen, the amount of hydrogen included in the silicon nitride film of the present invention is smaller than that of the silicon nitride film formed by high temperature plasma CVD conventionally as a comparative example. It is an established theory that the content of hydrogen in a film becomes high in the case of low temperature CVD. However, the silicon nitride film of the present invention contains less hydrogen, even when forming it at low deposition temperature of 80° C. Thus, electronic devices using the silicon nitride film of the present invention does not easily cause defects due to degasification, even when a heat treatment is performed thereon in a process after forming the silicon nitride film of the present invention.

Note that the hydrogen concentration of the silicon nitride film of the present invention is from 1 atomic % to 25 atomic %, from 5 atomic % to 20 atomic % for better characteristics, preferably, from 10 atomic % to 16 atomic %.

Such several distinctive characteristics are specific to a silicon nitride film manufactured by a method for manufacturing a silicon nitride film (temperature, gas kind, flow-rate ratio) according to the present invention and these characteristics can make even a film formed at low temperature of 80° C. extremely dense and favorable in the characteristics.

Embodiment Mode 2

This embodiment mode shows examined results of parameter in depositing, which is thought to have a large influence on film quality. Note that parameter in forming a silicon nitride film of the present invention is determined based on the results.

Table 5 shows a compared result of etching rate of silicon nitride films which are formed by changing only reaction pressure under the same conditions. Etching is performed on buffered hydrogen fluoride including HF of 4.7% and NH$_4$F of 36.3% (made by Morita Chemical Industries Co., Ltd, 110—Buffered Hydrogen Fluoride) at room temperature.

TABLE 5

| Pressure (Torr) | Etching rate (Å/min) |
| --- | --- |
| 0.1 | 275 |
| 0.2 | more than 2600 |

This shows that the etching rate is about ten times higher, when deposition pressure is changed from 0.1 Torr to 0.2 Torr. Although the result shows that a favorable film is thought to be formed with a lower deposition pressure, the deposition speed is slower as the deposition pressure is lower. Thus, the deposition pressure of from 0.01 Torr to 0.1 Torr is appropriate.

Figure 2:
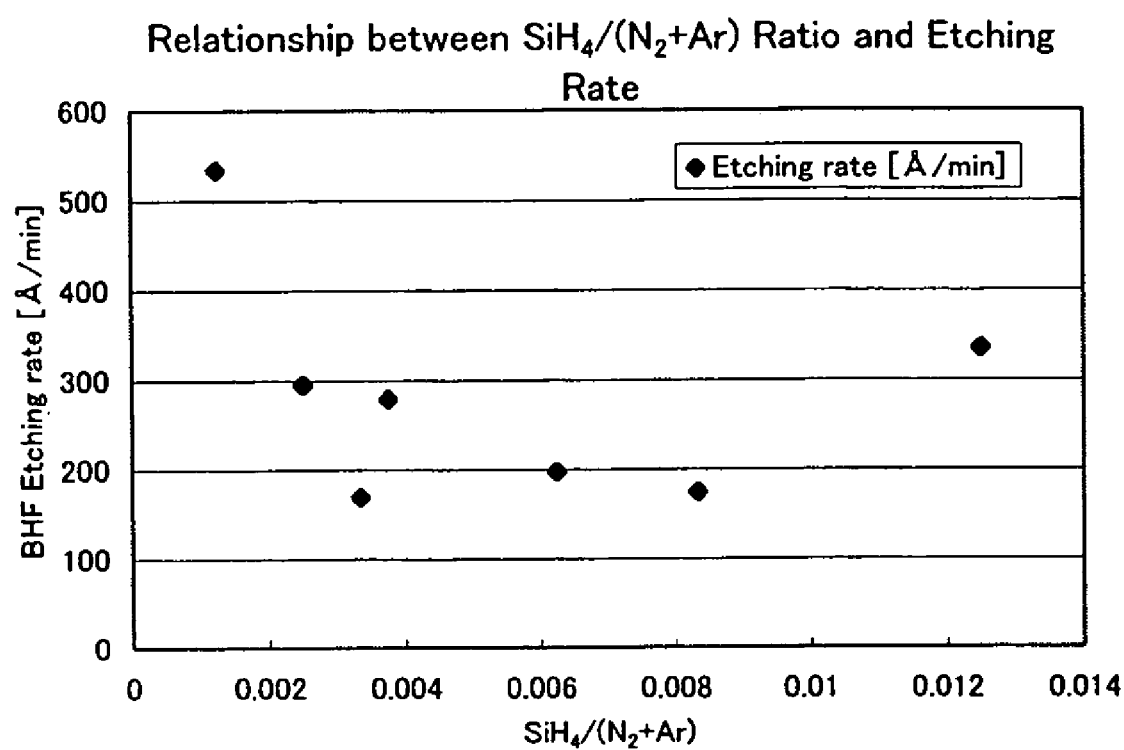
FIG. 2 shows a relation between an etching rate and a flow-rate ratio of deposition gases (SiH$_4$/N$_2$+Ar)

FIG. 2 shows a compared result of etching rate of a silicon nitride film that is formed with changed deposition gas flow-rate ratio. The etching rate is obtained by performing etching also on a buffered hydrogen fluoride including HF of 4.7% and NH$_4$F of 36.3% (made by Morita Chemical Industries Co., Ltd, 110—Buffered Hydrogen Fluoride) at room temperature.

The flow-rate ratio of the deposition gases (SiH$_4$/(N$_2$+Ar)) indicates minimum value in the vicinity of from 0.006 to 0.008. As the degree of denseness of the silicon nitride film, since an etching rate of 30.0 nm/min or less (preferably, 20.0 nm/min) is the value that can bear practical use from the viewpoint of barrier characteristics, the deposition is preformed under conditions of the flow-rate ratio of at least 0.002. In addition, light-transmittance of the film decreases when the flow-rate ratio of SiH$_4$ is large. Thus, the flow-rate ratio of SiH$_4$ to N$_2$+Ar is preferably within in the range from 0.002 to 0.006 when the silicon nitride film is formed as a passivation film on a light-emission side in a display device.

The silicon nitride film that is formed under the above-mentioned deposition conditions, even when it is formed at 100° C. or less, preferably from 60° C. to 85° C., shows characteristics shown in Embodiment Mode 1 and is dense and favorable in barrier characteristics.

Embodiment Mode 3

Figure 3A:
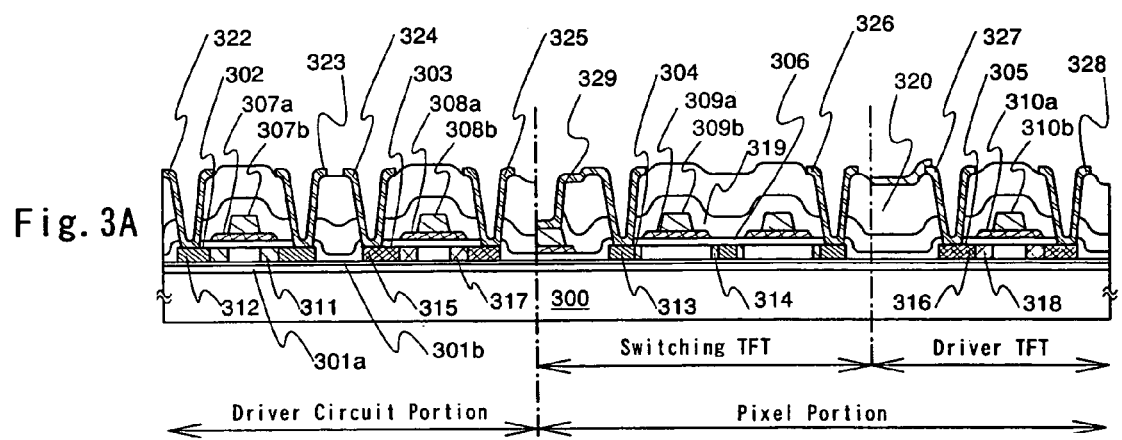
FIGS. 3A to 3C show an example of a method for manufacturing a display device.
Figure 3B:
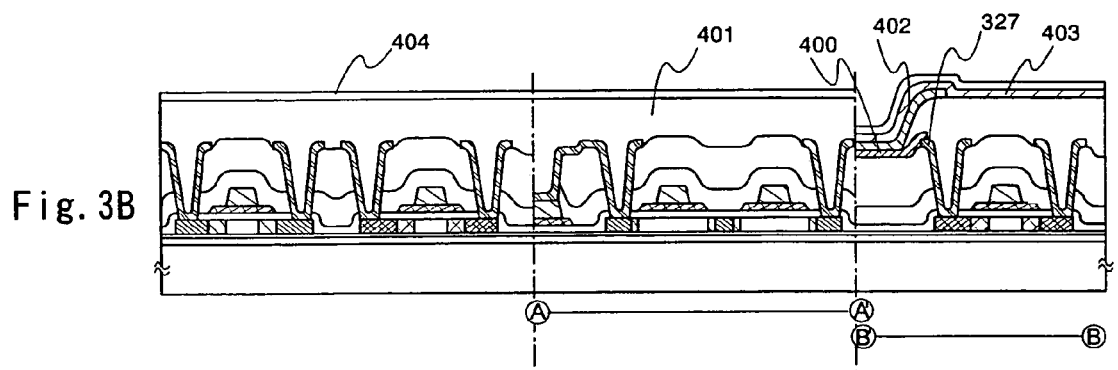
Figure 3C:
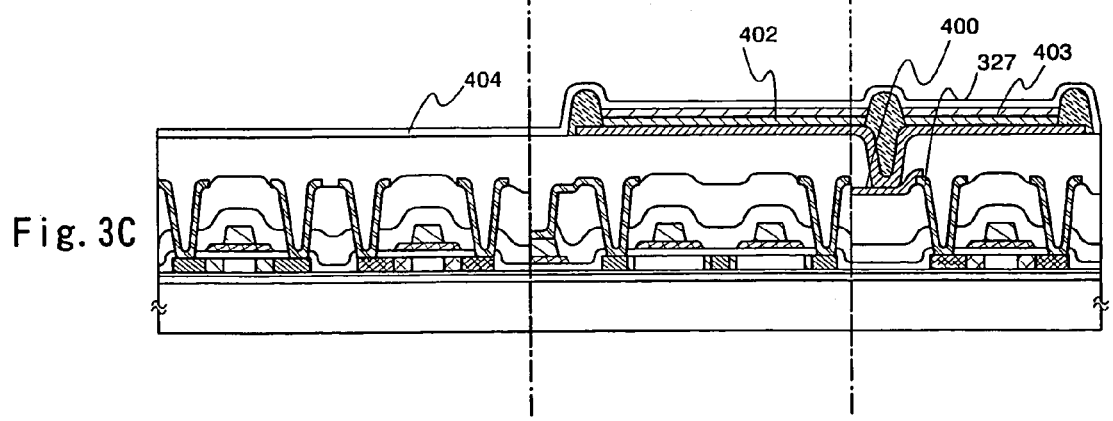

This embodiment mode shows an example of using a silicon nitride film of the present invention as a passivation film of an electroluminescent display device with reference to FIGS. 3A to 3C.

Base insulating films 301a and 301b are formed on a substrate 100. The substrate 100 may be an insulating substrate such as a crystalline glass, a glass substrate or a quartz substrate, a ceramic substrate, a stainless substrate, a metal substrate (tantalum, tungsten, molybdenum and the like), a semiconductor substrate, a plastic substrate (polyimide, acryl, polyethylene terephthalate, polycarbonate, polyarylate, polyethersulfone and the like), or a substrate which can resist the heat generated in a process. A glass substrate is used in this embodiment mode.

The base insulating films 301a and 301b are formed with a single layer or lamination of two or more of insulating films such as a silicon oxide film, a silicon nitride film, and a silicon oxynitride film. These films are formed by using a known method such as sputtering, reduced pressure CVD, or plasma CVD. This embodiment mode employs a lamination of two layers; however, a single layer or a lamination of three or more layers may be employed as well. In this embodiment mode, the insulating layer 301a as the first layer is formed from a silicon nitride oxide film of 50 run in thickness, and the insulating layer 301b as the second layer is formed from a silicon oxynitride film of 100 nm in thickness. It should be noted that the silicon nitride oxide film and the silicon oxynitride film are different in the proportion of nitrogen and oxygen. The former has more nitrogen than the latter.

Subsequently, an amorphous semiconductor film is formed. The amorphous semiconductor film may be formed from silicon or a silicon-based material (for example Si$_x$Ge$_{1-x}$ and the like) of from 25 nm to 80 nm (preferably from 30 nm to 60 nm) in thickness. As a manufacturing method, a known method such as sputtering, low pressure CVD, or plasma CVD may be used. In this embodiment mode, the amorphous semiconductor film is formed from amorphous silicon of 50 nm in thickness.

Subsequently, the amorphous silicon is crystallized. In this embodiment mode, the amorphous silicon is doped with an element for promoting crystallization, and heated to be crystallized. After the crystallization by the heat treatment, laser crystallization may be performed.

A thin layer containing nickel is formed on the surface of the semiconductor film by applying by using a spinner a nickel acetate solution or a nickel nitrate solution containing nickel in a concentration of 5 to 10 ppm. The nickel element may be scattered on the whole surface of the semiconductor film by sputtering instead of applying by spinner. As a catalytic element, one or a plurality of the elements such as iron (Fe), palladium (Pd), tin (Sn), lead (Pb), cobalt (Co), platinum (Pt), copper (Cu), gold (Au) may be used as well as nickel (Ni).

Subsequently, the amorphous semiconductor film is crystallized by heating. It may be carried out at temperatures from 500° C. to 650° C. for about 4 to 24 hours since a catalytic element is used. The semiconductor film becomes a crystalline semiconductor film by this crystallization treatment.

The crystalline semiconductor film is etched to form crystalline semiconductor layers each having a desired shape 302 to 305, after forming the crystalline semiconductor film. Note that the crystallization treatment may be performed after a semiconductor layer is etched to have a desired shape as an amorphous semiconductor layer.

Then, the semiconductor film is crystallized by a laser to improve the crystallinity. As a laser oscillator, a pulsed or a continuous wave gas or solid state and a metal laser oscillator may be used to perform a laser crystallization. As a gas laser, excimer laser, Ar laser, Kr laser and the like may be used, while as a solid state laser, YAG laser, YVO$_4$ laser, YLF laser, YAJO$_3$ laser, glass laser, ruby laser, alexandrite laser, sapphire laser may be used, and helium cadmium laser, copper steam laser, gold steam laser may be used as a metal laser. One or a plurality of the elements Cr$^{3+}$, Cr$^{4+}$, Nd$^{3+}$, Er$^{3+}$, Ce$^{3+}$, Co$^{2+}$, Ti$^{3+}$, Yb$^{3+}$, or V$^{3+}$ is doped to a crystal of laser medium of a solid state laser as an impurity.

A laser beam oscillated from a laser oscillator may be emitted in a linear shape by using an optical system. The linear laser beam can be obtained by using a conventional cylindrical lens or a concave mirror. The laser beam may be irradiated with the power density in the range of from 0.01

MW/cm² to 100 MW/cm² in the atmospheric air, an atmosphere of which oxygen concentration is controlled, an $N_2$ atmosphere, or in vacuum. Further, in the case of using a pulsed laser, it is preferable that the frequency is from 30 Hz to 300 Hz and the laser energy density is from 100 mJ/cm² to 1500 mJ/cm² (representatively from 200 mJ/cm² to 500 mJ/cm²). The laser beam may be irradiated while overlapping by 50 to 98% by calculating with FWHM.

Further, gettering of nickel used for crystallization may be performed. A method for gettering is given as the next method, for example. The surface is treated with ozone water first, and then a barrier film is formed in thickness of from 1 nm to 5 nm, and a gettering site is formed on the barrier film by sputtering. The gettering site is formed by depositing an amorphous silicon film containing argon element of 150 nm in thickness. The gettering site is formed under deposition conditions: deposition pressure of 0.3 Pa, a flow rate of gas (Ar) of 50 (sccm), deposition power of 3 kW and substrate temperature of 150° C. Further, the atomic concentration of the argon element included in the amorphous silicon film falls in the range of from $3 \times 10^{20}/cm^3$ to $6 \times 10^{20}/cm^3$ and the atomic concentration of oxygen falls in the range of from $1 \times 10^{19}/cm^3$ to $3 \times 10^{19}/cm^3$ under the above-described conditions. Thereafter, gettering is carried out by heating at 650° C. for 3 minutes by using a lamp annealing device. The gettering region may be removed by etching.

Next, a gate insulating layer 306 is formed. An insulating layer containing silicon may be formed in thickness of approximately 115 nm by low pressure CVD, plasma CVD, sputtering or the like. A silicon oxide film of 10 nm thick is formed in this embodiment mode. The silicon oxide film can be formed by mixing and discharging TEOS (Tetraethyl Ortho Silicate) and $O_2$ by the plasma CVD with a reaction pressure of 40 Pa, the substrate temperature of from 300° C. to 400° C., the high frequency (13.56 MHz) power density in the range of from 0.5 W/cm² to 0.8 W/cm². The thus prepared silicon oxide film has an excellent characteristics as a gate insulating film by the subsequent heating at temperatures from 400° C. to 500° C.

Subsequently, a first conductive film of from 20 nm to 100 nm thick is formed over the gate insulating film and a second conductive film of from 100 nm to 400 nm thick is formed over the first conductive film. In this embodiment mode, a tantalum nitride (TaN) film of 30 nm in thickness is formed as the first conductive layer and a tungsten (W) film of 370 nm in thickness is formed as the second conductive layer. The TaN film and the W film may be both formed by sputtering. The TaN film may be formed in a nitride atmosphere by using Ta as a target, and the W film may be formed by using W as a target. Low resistance is preferable for using it as a gate electrode, in particular the resistance of the W film is preferably 20 μΩcm or less. Therefore, high purity (99.9999%) target of W is desirably used and further attention has to be paid not to let impurities in during deposition. The resistance of the W film formed like this can be from 9 μΩcm to 20 μΩcm.

Note that the first conductive layer is a TaN film and the second conductive layer is a W film in this embodiment mode, however, the first and second conductive layers are not limited thereto and may be formed of any element of Ta, W, Ti, Mo, Al, Cu, Cr, and Nd, or an alloy material or a compound material mainly containing the aforementioned element. Furthermore, a semiconductor film represented by a polycrystalline silicon film doped with an impurity element such as phosphorous may be used. An AgPdCu alloy may be utilized as well. A combination thereof may be selected appropriately. In this embodiment mode, the lamination of two layers are employed; however, one layer or three or more layers may be laminated as well.

In order to form electrodes and wirings by etching the conductive layer, a mask of resist is formed through exposure to light by photolithography and etching is carried out.

A first etching is performed under first and second etching conditions. A gate electrode and wirings are formed by etching with the mask of resist. The etching conditions may be selected appropriately.

Herein, ICP (Inductively Coupled Plasma) etching is employed. As the first etching conditions, $CF_4$, $Cl_2$, and $O_2$ are used as etching gases with the gas-flow ratio of 25/25/10 (sccm), and at a pressure of 1.0 Pa, an RF power of 500 W (13.56 MHz) is applied on the coil electrode to generate plasma to conduct etching. An RF power of 150 W (13.56 MHz) is applied to a substrate (sample stage) side to apply a substantially negative self bias voltage. The W film is etched under the first etching conditions to make the edges of the first conductive layer to have a tapered shape. An etching rate on the W film under the first etching conditions is 200.39 nm/min, the etching rate on the TaN layer is 80.32 nm/min, and the selectivity ratio of W to TaN is approximately 2.5. Further, the taper angle of the W film is about 26° under the first etching conditions.

Subsequently, etching is carried out under the second etching conditions. Etching is performed for about 15 seconds with the mask made of resist left, by using $CF_4$ and $Cl_2$ as etching gases with the gas-flow ratio of 30/30 (sccm), and at a pressure of 1.0 Pa, an RF power of 500 W (13.56 MHz) is applied on the coil electrode to generate plasma to conduct etching. An RF power of 20 W (13.56 MHz) is applied to a substrate (sample stage) side to apply a substantially negative self bias voltage. Under the second etching conditions in which $CF_4$ and $Cl_2$ are mixed, both of the W film and the TaN film are etched to the same extent. The gate insulating layer which is not covered with electrodes is etched by about from 20 nm to 50 nm in this first etching.

The edge portions of the first and second conductive layers become tapered in the first etching due to the bias voltage applied to the substrate side. As described, a conductive layer having a first shape that is made of the first and second conductive layers is formed in the first etching.

The second etching is carried out without removing the mask made of resist. The second etching is performed using $SF_6$, $Cl_2$, and $O_2$ as etching gases with the gas-flow ratio of 24/12/24 (sccm), and at a pressure of 1.3 Pa, an RF power of 700 W (13.56 MHz) is applied on the coil electrode to generate plasma to conduct etching for about 25 seconds. An RF power of 10 W (13.56 MHz) is applied to a substrate (sample stage) side to apply a substantially negative self bias voltage. The W film is selectively etched by this etching to form a conductive layer having a second shape 307a to 310a and 307b to 310b.

A first doping is carried out without removing the mask of resist. Thus, an N-type impurity is doped in a low concentration to the crystalline semiconductor layers 302 to 305. The first doping may be performed by ion doping or ion implantation. The ion doping may be performed with the dosage of $1 \times 10^{13}$ to $5 \times 10^{14}$ atoms/cm², and an acceleration voltage of from 40 kV to 80 kV. The ion doping is carried out at an acceleration voltage of 50 kV in this embodiment mode. The N-type impurity may be an element of the group 15 of the periodic table represented by phosphorous (P) or arsenic (As). Phosphorous (P) is used in this embodiment mode. The first conductive layers 307a to 310a is used as a mask to form a first impurity region (N region) to which an impurity of low concentration is doped, in a self-aligned manner.

Subsequently, the mask made of resist is removed. Then, a new mask made of a resist is formed to cover a region for forming a low concentration impurity region of the semiconductor layer 304 and the semiconductor layers 303 and 305 for forming a p-channel TFT and the second doping is carried out at a higher acceleration voltage than the first doping. The n-type impurity is added in the second doping as well. The ion doping may be performed with the dosage of $1 \times 10^{13}$ to $3 \times 10^{15}$ atoms/cm$^2$, and an acceleration voltage of from 60 kV to 120 kV. The ion doping is carried out with the dosage of $3.0 \times 10^{15}$ atoms/cm$^2$ and an acceleration voltage of 65 kV in this embodiment mode. The second doping is carried out so that the impurity element is doped into the semiconductor layer under the first conductive layer by using the second conductive layer as a mask against the impurity element.

By the second doping, a second impurity region 311 (N$^-$region, Lov region) is formed on the part where the second conductive layers 307b to 310b are not overlapped or the part which is not covered with the mask in the part where the crystalline semiconductor layers 302 to 305 is overlapped with the first conductive layers 307a to 310a. The N-type impurity is doped into the second impurity region 311 at the concentration ranging from $1 \times 10^{18}$ atoms/cm$^3$ to $5 \times 10^{19}$ atoms/cm$^3$. Further, the exposed parts 312, 313 (third impurity region: N$^+$region) which are not covered with either the first shaped conductive layers 307a to 310a nor the mask is doped at a high concentration N-type impurity ranging from $1 \times 10^{19}$ atoms/cm$^3$ to $5 \times 10^{21}$ atoms/cm$^3$. The semiconductor layer 304 has an N$^+$ region, a part 314 of which is covered only with the mask. The concentration of the N-type impurity of this part is not changed from the concentration of the impurities doped in the first doping.

Note that each impurity region is formed by two doping treatments in this embodiment mode; however, the invention is not limited to this. The impurity region having a desired impurity concentration may be formed by one or a multiple doping by determining the condition appropriately.

Subsequently, the mask made of resist is removed and a new mask formed of a resist is formed over the semiconductor layers 302 and 304 that form an n-channel TFT to conduct a third doping. Fourth impurity regions (P+region) 315 and 316 and a fifth impurity regions (P$^-$region) 317 and 318 into which an impurity element having the opposite conductivity to the ones of the first and second conductive layers is added, are formed by the third doping in the semiconductor layer forming a p-channel TFT.

In the third doping, the fourth impurity region (P+region) is formed on the parts 315 and 316 which are not covered with the mask of resist and not overlapped with the first conductive layer. The fifth impurity region (P$^-$region) is formed on the parts 317 and 318 which are not covered with the mask of resist, but which are overlapped with the first conductive layer, and not overlapped with the second conductive layer. The P$^{31}$ type impurity element may be boron (B), aluminum (Al), gallium (Ga) or the like, each of which are of the group 13 of the periodic table.

In this embodiment mode, boron is used as a P-type impurity element to form the fourth and fifth impurity regions by ion doping using diborane ($B_2H_6$). Ion doping is carried out with the dosage of $1 \times 10^{16}$ atoms/cm$^2$ and an acceleration voltage of 80 kV.

The fourth impurity regions (P$^+$region) 315 and 316 and the fifth impurity regions (P$^-$region) 317 and 318 are doped with phosphorous of different concentrations by the first and second doping. However, in all of the fourth impurity regions (P$^+$region) 315, 316 and the fifth impurity regions (PP$^-$region) 317, 318, the third doping is performed so that the concentration of the P-type impurity element is $1 \times 10^{19}$ to $5 \times 10^{21}$ atoms/cm$^2$. Therefore, the fourth impurity regions (P$^+$region) 315 and 316 and the fifth impurity regions (P$^-$region) 317 and 318 serve as source region and drain region of a p-channel TFT without problems.

The fourth impurity regions (P+region) 315 and 316 and the fifth impurity regions (P$^-$region) 317 and 318 are formed by once of third doping in this embodiment mode, however, the present invention is not limited to this. The fourth impurity regions (P$^+$region) 315 and 316 and the fifth impurity regions (P$^-$region) 317 and 318 may be formed by multiple doping treatments according to each doping condition.

Subsequently, the mask of resist is removed to form a first passivation layer 319. As the first passivation layer, an insulating film containing silicon is formed in thickness of from 100 nm to 200 nm by plasma CVD or sputtering. In this embodiment mode, a silicon oxynitride film is formed in thickness of 100 nm by plasma CVD. In the case of using a silicon oxynitride film, a silicon oxynitride film formed of $SiH_4$, $N_2O$, and $NH_3$ by plasma CVD, or a silicon oxynitride silicon film formed of $SiH_4$ and $N_2O$ may be used. In this case, the film is formed with a reaction pressure of from 20 Pa to 200 Pa, a substrate temperature of 300 to 400° C., and a high frequency (60 MHz) electronic density from 0.1 W/cm$^2$ to 1.0 W/cm$^2$. Further, a silicon oxynitride hydride film formed of $SiH_4$, $N_2O$, and $H_2$ may be employed as the first passivation layer 319. It is needless to say that the first passivation layer 319 is not limited to a single layer structure of the silicon oxynitride film as in this embodiment mode, but other insulating layer containing silicon having a single or a laminated structure may be utilized.

Thereafter, crystallinity of the semiconductor layer is recovered and the impurity element doped in the semiconductor layer is activated by heating (heat treatment). Heating may be performed under the conditions of oxygen concentration of 1 ppm or less, preferably in the nitrogen atmosphere of 0.1 ppm or less, at a temperatures from 400° C. to 700° C. In this embodiment mode, the semiconductor layer is activated by beating at a temperature of 410° C. for one hour. Note that laser annealing or rapid thermal annealing (RTA) may be employed instead of heating.

By heating the semiconductor layer after forming the first passivation layer 319, it can be hydrogenated as well as activated. Hydrogenation is a method by which a dangling bond in the semiconductor layer is terminated by hydrogen in the first passivation layer 319.

A heat treatment may be carried out before forming the first passivation layer 319; however, it is preferable to carry out the heat treatment after forming the first passivation layer 319 in order to protect wirings and the like, as in this embodiment mode, in the case where the materials constituting first conductive layers and second conductive layers are sensitive to heat. Further, in the case of heating before forming the first passivation layer, hydrogenation by using hydrogen contained in the passivation layer cannot be performed since the first passivation layer 319 is not formed yet.

In this case, hydrogenation may be performed by using hydrogen excited by plasma (plasma hydrogenation) or by heating at temperatures from 300° C. to 450° C. for 1 to 12 hours in an atmosphere containing from 3% to 100% of hydrogen.

Subsequently, a first interlayer insulating layer 320 is formed on the first passivation layer 319. The first interlayer insulating layer 320 may be an inorganic insulating layer or an organic insulating layer. The inorganic insulating layer may be a silicon oxide film formed by CVD, a silicon oxide film applied by SOG (Spin On Glass). The organic insulating layer may be a film of polysiloxane, polyimide, polyamide, BCB (benzocyclobutene), acryl or positive photosensitive organic resin, negative photosensitive organic resin and the like. Also, a lamination of an acryl film and an silicon oxynitride film may be used.

An acryl film is formed in thickness of 1.6 μm in this embodiment mode. By the first interlayer insulating layer 320, concavo-convex portions due to the TFTs can be alleviated and planarized. The first insulating layer 320 plays a significant role in planarization, therefore, an easily planarized material is preferably used for it.

Thereafter, a second passivation film 321 made of a silicon nitride film of the present invention may be formed over the first interlayer insulating film 320. The second passivation film may be formed in thickness of about from 10 nm to 200 nmn, which can protect the first interlayer insulating film 320 from moisture. The second passivation film 321 may be formed by the method of Embodiment Mode 1.

The second passivation film 321, the first interlayer insulating film 320 and the first passivation film 319 are etched to form contact holes to reach the third impurity regions 312 and 313 and the fourth impurity regions 315 and 316.

Subsequently, wirings 322 to 328 and an electrode 329 which electrically connect to each impurity region are formed. It should be noted that these wirings are formed by patterning the lamination of a Ti film of 50 nm in thickness and an alloy film (Al and Ti) of 500 nm in thickness. It is needless to say that the lamination is not limited to two-layer lamination, and a signal layer or three or more layers may be laminated as well. Further, the material for the wirings is not limited to Al and Ti. For example, a lamination in which an Al film or a Cu film may be formed on the TaN film and then the Ti film is formed thereon may be patterned to form wirings.

Thus, a semiconductor device of the present invention shown in FIG. 3A can be obtained.

A TFT of the present invention shown in FIG. 3A is formed and then a first electrode 400 formed of a transparent conductive film is formed so as to partially overlap with a wiring 327 of the TFT. The transparent conductive film is preferably formed by using a material with a high work function, for example, a compound of indium oxide and tin oxide (ITO), a compound of indium oxide and zinc oxide, zinc oxide, tin oxide, indium oxide, titanium nitride or the like can be used. Alternatively, the transparent conductive film added with gallium, an ITO film formed by sputtering using a target mixed with $SiO_2$ may be used. The first electrode 400 serves as an anode of the light emitting element. In this embodiment mode, ITO is used as the first electrode 400. The ITO is formed in thickness of 0.1 μm by sputtering.

Subsequently, an insulator 401 is formed so as to cover the edge face of the electrode. The insulator 401 can be formed from an inorganic or organic material. It is advantageous to form it by using a photosensitive organic material since a break in the film and the like do not occur easily in an opening portion in depositing a light-emitting layer and better coverage can be obtained.

Thereafter, the substrate is removed of dusts and the like by wiping with a PVA (polyvinyl alcohol)-based porous material. It should be noted that in this embodiment mode, fine powder (dusts) generated when the ITO and the insulating layer are etched are removed by wiping with the PVA-based porous material.

Subsequently, PEDOT may be applied on the whole surface and baked as a pretreatment before depositing a light emitting layer. At this time, it is preferable to rinse the substrate after applying PEDOT, and then apply PEDOT again, since PEDOT is not good in wettability with ITO. Then, the substrate is heated at reduced pressure atmosphere after vaporizing moisture by heating at normal pressure. It should be noted that the substrate is heated at 170° C. at reduced pressure atmosphere for four hours after applying PEDOT, and then naturally cooled for 30 minutes.

Then, the substrate is deposited by moving an evaporation source with a deposition apparatus. For example, deposition is performed in a deposition chamber which is vacuum evacuated to $5 \times 10^{-3}$ Torr (0.665 Pa) or less, preferably to $10^{-4}$ to $10^6$ Torr. When the deposition is performed, an organic compound is vaporized by resistive heating in advance and scatters in the direction of the substrate when a shutter is opened in deposition. The vaporized organic compound scatters upwardly and is deposited on the substrate through the opening portion provided on a metal mask to form a light emitting layer 402 (including a hole transport layer, a hole injection layer, an electron transport layer, and an electron injection layer).

An example in which the light-emitting layer 402 is formed by deposition is shown here, however, the invention is not limited to this. A light-emitting layer formed of high-molecular material may be formed by an application method (such as spin coating or inkjet). Further, this embodiment mode describes an example in which layers formed of a low-molecular material are laminated as an organic compound layer, however, a layer formed of a high-molecular material and a layer formed of a low-molecular material may be laminated as well. In addition, RGB light emitting layers may be formed to achieve full color display, or in the case of forming a monochrome light emitting layer, full color display may be achieved by using a color conversion layer or a color filter. In addition, inorganic materials may be used as well.

It is assumed that a light emitting element emits light in such a way that an electron injected from cathode and a hole injected from anode form a molecular exciton by recombining at the center of light emission in an organic compound layer when voltage is applied to between a pair of electrodes with the organic compound layer therebetween, and energy is discharged to emit light when the molecular exciton returns to the ground state. The exciton state is known to include a singlet exciton and a triplet exciton, through either of which light can be emitted.

A light emitting layer typically has a laminated structure. The typical laminated structure is constituted as "a hole transport layer, an electroluminescent layer, and an electron transport layer". This structure has such a high luminous efficiency that the light emitting devices which are recently researched and developed mostly employ this structure. The structure in which a hole injection layer, a hole transport layer, an electroluminescent layer, and an electron transport layer are laminated on the anode, or a structure in which a hole injection layer, a hole transport layer, an electroluminescent layer, an electron transport layer, and an electron injection layer are laminated in these orders may be employed as well. A fluorescent pigment and the like may be doped into the electroluminescent layer.

It should be noted that all the layers provided between the cathode and anode are referred to as a light emitting layer collectively in this specification. Therefore, the above described hole injection layer, hole transport layer, electroluminescent layer, electron transport layer and electron injection layer are all included in the light emitting layer. These layers can be formed of any one or an appropriate combination of a low-molecular weight organic compound material, a medium-molecular weight organic compound material, or a high-molecular weight organic compound material. In addition, a mixed layer of an electron transport material and a hole transport material, or a mixed junction in which a mixed region is formed in each junction boundary may be formed. Further, an inorganic light emitting material may be used instead of the organic material.

Subsequently, a second electrode 403 is formed as a cathode over the light emitting layer 402. The second electrode 403 may be formed from a thin film containing a metal with a small work function (such as Li, Mg, or Cs). In addition, it is preferable that the second electrode be made of a laminated film in which a transparent conductive film (ITO (alloy of indium oxide and tin oxide), an alloy of indium oxide and zinc oxide ($In_2O_3$—ZnO), or zinc oxide (ZnO), or the like) is laminated on the thin film containing Li, Mg, Cs, or the like. Further, the second electrode may be formed in thickness of from 0.01 μm to 1 μm by electron beam deposition, although the film thickness may be determined appropriately to serve as a cathode.

In the case of using the electron beam deposition, radioactive rays are generated when the acceleration voltage is too high, thereby damaging a TFT. On the other hand, in the case where the acceleration voltage is too low, a deposition rate is lowered and the productivity is decreased. In view of the foregoing problems, the second electrode 403 is formed not to be thicker than the thickness enough to serve as a cathode. When the cathode is thin, the productivity is not affected so much even when the deposition rate is low. Although resistance may become higher due to the thin cathode in this case, this problem can be solved by laminating a low resistance metal such as Al on the cathode by resistive heating, sputtering or the like.

Over the insulator 401 and the second electrode 403, a silicon nitirde film of the present invention is formed as a third passivation layer 404. The second passivation layer 321 and the third passivation layer 404 are both made of a film which hardly penetrate the substance such as moisture or oxygen which deteriorate a light emitting element. Since the silicon nitride film of the present invention is dense, it can be used effectively for the passivation film which does not easily penetrate substances that cause deterioration of such light emitting element. Further, the light emitting element is less damaged by heat, since the deposition temperature of 100° C. or less, (preferably from 60° C. to 85° C.) and the silicon nitride film is extremely favorable. Embodiment Mode 1 may be referred to concerning a method for forming the third passivation film.

As for the flow-rate ratio of the deposition gases, light-transmittance of a film is not limited in particular, in the case of an example in which light is emitted through the substrate side (bottom) as shown in FIG. 3B. Thus, the flow-rate ratio of the deposition gases ($SiH_4/(N_2+Ar)$) may be selected within the range from 0.002 to 0.012.

Thus, a light emitting element shown in FIG. 3B can be obtained. Although not shown, a plastic film is provided as a sealing material thereon and an inert gas is filled between the light emitting element and the sealing agent. Then, the substrate is connected to an external terminal by an FPC (Flexible Printed Circuit) by using anisotropic conductive film to complete a light emitting display device (display module) of the present invention.

FIG. 3B shows an example in which light is emitted from the substrate side (bottom). Light can also be emitted from the top in a laminated structure shown in FIG. 3C. In that case, the second electrode may be formed from a light-transparent material. Further, the third passivation film is preferably enough light-transparent. In the case of using the silicon nitride film of the present invention, the flow-rate ratio of the deposition gases ($SiH_4/(N_2+Ar)$) may be selected within the range from 0.002 to 0.006.

Since a silicon nitride film of the present invention is used as the passivation film of a light-emitting layer, it is possible to form a dense silicon nitride film that does not easily penetrate oxygen or moisture, over a light-emitting element, without damaging an interlayer insulating film or an light-emitting element due to heat. It is also possible to suppress deterioration of a semiconductor device or a light-emitting element and to obtain a semiconductor device and a light-emitting element of the present invention that can enhance the reliability greatly.

Embodiment Mode 4

Figure 4A:
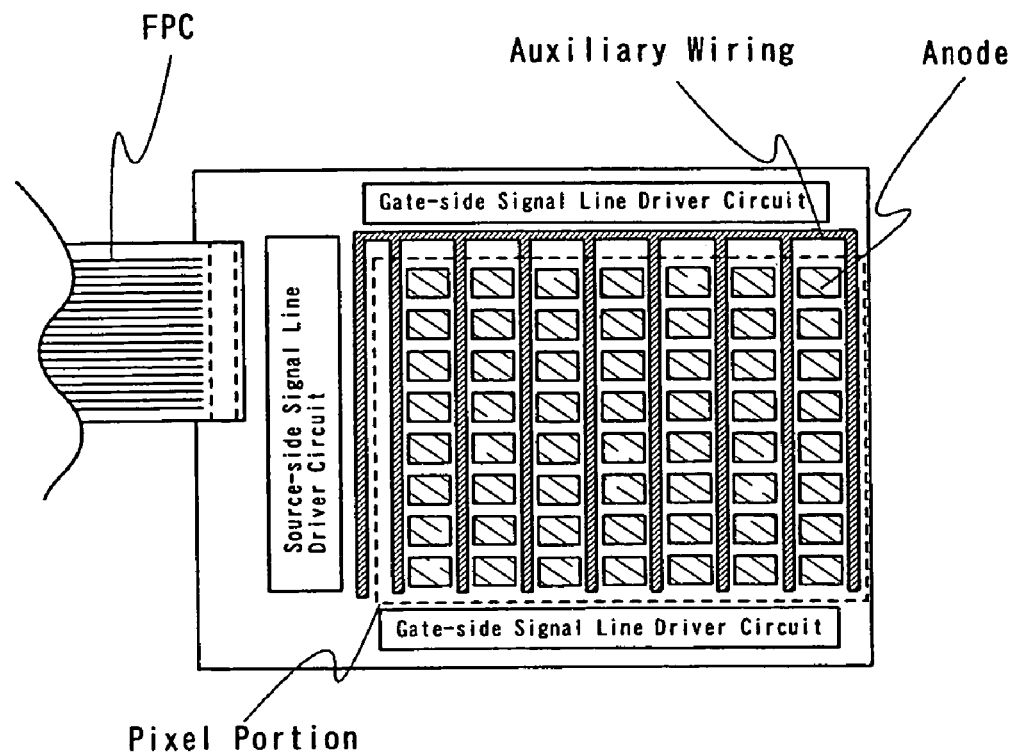
FIGS. 4A to 4C show an example of an auxiliary wiring.

In this Embodiment Mode, an example in which a silicon nitride film of the present invention is formed as a passivation film of an auxiliary wiring formed by a droplet discharging method (such as ink-jetting) is described with reference to FIG. 4A to 4C. FIG. 4A is a top conceptual view of a light-emitting display device manufactured in FIGS. 3A to 3C.

Figures 4B, 4C:
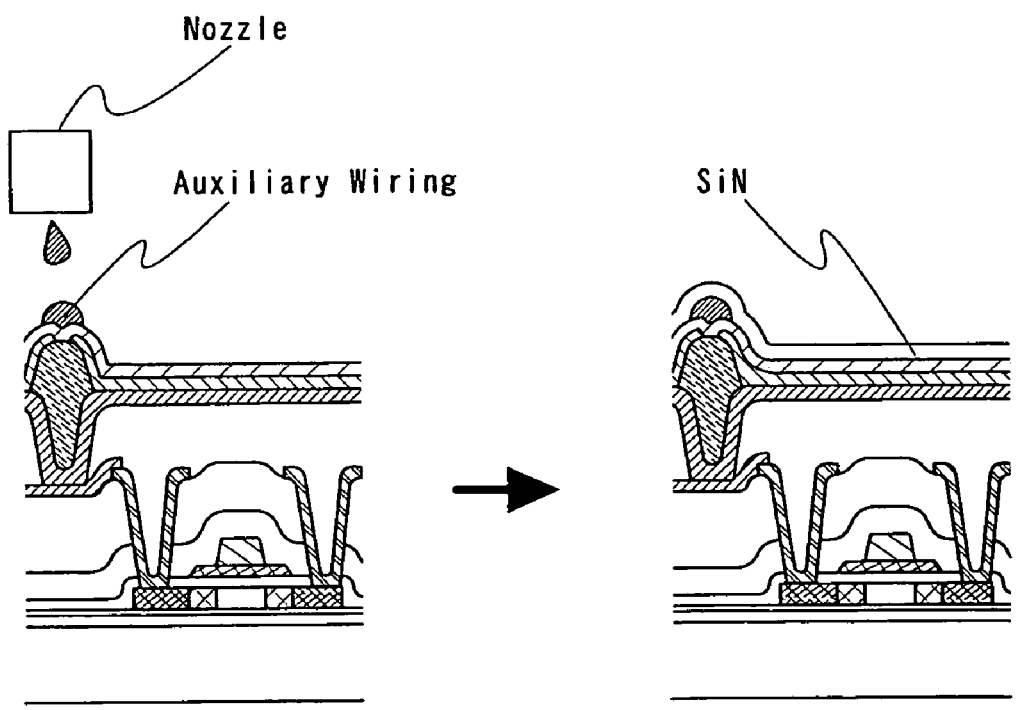

An auxiliary wiring is drawn by a droplet discharging method (such as ink-jetting) by using a nozzle of a droplet discharging apparatus as shown in FIG. 4B. FIG. 4B shows a cross-sectional view of one pixel in a pixel portion shown in FIG. 4A. The auxiliary wiring is formed on a transparent electrode 73 that serves as a cathode of a light-emitting element in order to reduce resistance of the whole electrode. Further, the auxiliary wiring also serves as a light-shielding film, thereby enhancing contrast.

When this auxiliary wiring is formed by a droplet discharging method, a solution dispersed with metal nanoparticles is discharged. However, in the case of using a metal such as silver, in particular, that easily migrates, there is a fear that the periphery is likely to be contaminated by the wiring material. At the time, migration of a metal is prevented by covering with a dense film having good barrier characteristics such as a silicon nitride film of the present invention, as shown in FIG. 4C, thereby preventing contamination. The auxiliary wiring is formed in an upper portion of an electroluminescent element, but since it is possible to form a silicon nitride film of the present invention at a temperature of 100° C. or less (preferably, from 60° C. to 85° C.), a passivation film can be formed without damaging an electroluminescent element by heat in depositing, thereby making it possible to manufacture a light-emitting display device having better reliability.

Embodiment Mode 5

Figure 5:
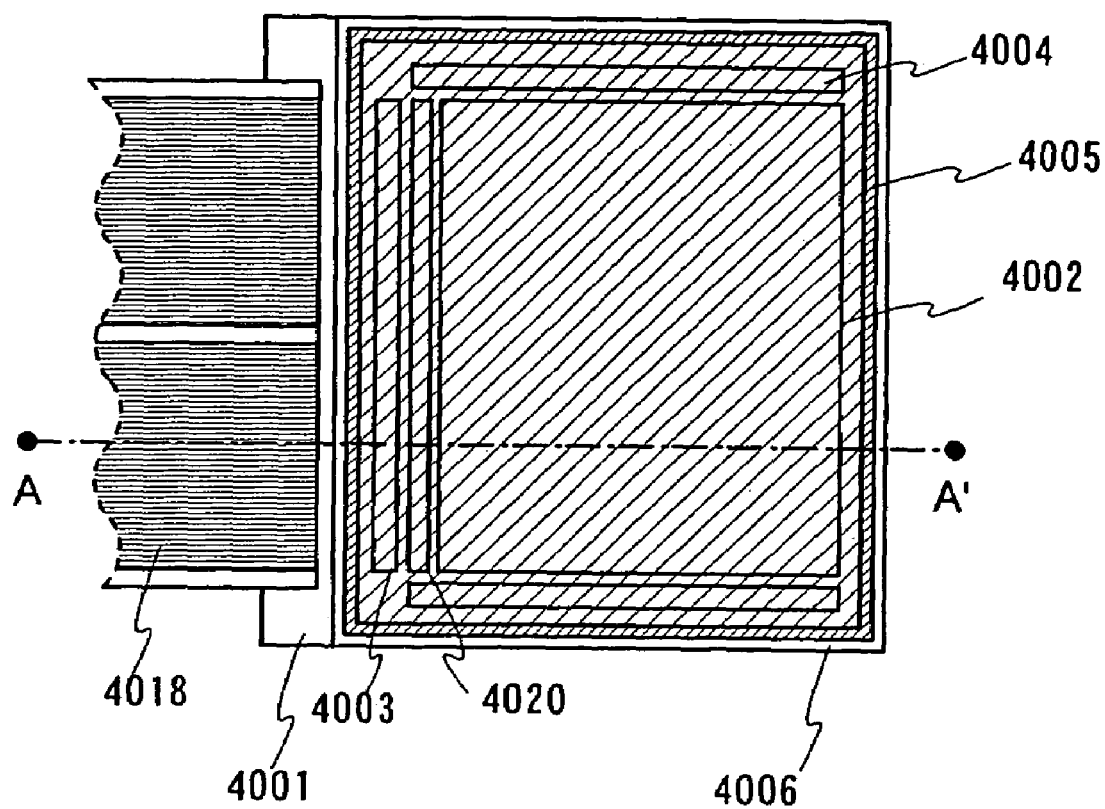
FIG. 5 is a top view of an example of a module configuration.

In this embodiment mode, appearance of a panel of a light-emitting device corresponding to one mode of the present invention is described with reference to FIG. 5. FIG. 5 is a top view of the panel in which a transistor and a light-emitting element that are formed on a substrate are sealed by a sealing material between the substrate and an opposite substrate 4006.

A sealing material 4005 is provided to surround a pixel portion 4002, a signal processing circuit 4003, and a scanning line driver circuit 4004 formed on a substrate 4001. In addition, the opposite substrate 4006 is provided over the pixel portion 4002, the signal processing circuit 4003, a signal line driver circuit 4020 and the scanning line driver circuit 4004. Thus, the pixel portion 4002, the signal processing circuit 4003, the signal line driver circuit 4020 and the scanning line driver circuit 4004 are hermetically sealed with a filler by the substrate 4001, the sealing material 4005 and the opposite substrate 4006.

The pixel portion 4002, the signal processing circuit 4003, the signal line driver circuit 4020 and the scanning line driver circuit 4004 that are each formed over the substrate 4001 each include plural thin film transistors.

A leading wiring corresponds to a wiring for supplying signals or power supply voltage to the pixel portion 4002, the signal processing circuit 4003, the signal line driver circuit 4020 and the scanning line driver circuit 4004. The leading wiring is connected to a connection terminal 4016 and the connection terminal is electrically connected to a terminal of a flexible print circuit (FPC) 4018 through an anisotropic conductive film.

As the filler, in addition to an inert gas such as nitrogen or argon, an ultraviolet ray curable resin or a thermosetting resin can be used. Polyvinyl chloride, acryl, polyimide, epoxy resin, silicone resin, polyvinyl butyral, or ethylene-vinylene acetate can be used.

The display device of the present invention includes a panel in which a pixel portion having a light-emitting element is formed and a module in which an IC is mounted on the panel.

Embodiment Mode 6

Electronic devices of the present invention mounting a module, an example of which is shown in Embodiment Mode 5, include a video camera, a digital camera, a goggle type display (head mounted display), a navigation system, an audio player (such as a car audio compo) a computer, a game machine, a portable information terminal (such as a mobile computer, a cellular telephone, a portable game machine or an electronic book), an image reproducing device provided with recording medium (typically, a device provided with a display that can reproduce a recording medium such as DVD (digital versatile disc) and display the image) and the like. Practical examples thereof are shown in FIGS. 6A to 6E.

FIG. 6A shows a light-emitting display device. And a television image receiver or a monitor of a computer is given as an example of the light emitting display device. The light emitting display device includes a casing 2001, a display portion 2003, a speaker portion 2004 and the like. The reliability of the display portion 2003 or other mounted semiconductor devices is enhanced by the light-emitting display device of the present invention. A polarizing plate or a circular polarizing plate may be provided for a pixel portion to improve the contrast. Films may be provided in the order of a quarter wavelength plate, a half wavelength plate, a polarizing plate. Further, an antireflection film may be provided over the polarizing plate.

FIG. 6B shows a cellular phone including a main body 2101, a casing 2102, a display portion 2103, a sound input portion 2104, a sound output portion 2105, an operation key 2106, an antenna 2108, and the like. The reliability of the display portion 2103 or other mounted semiconductor devices is enhanced in the cellular phone of the present invention.

FIG. 6C shows a computer including a main body 2201, a casing 2202, a display portion 2203, a keyboard 2204, an external connection port 2205, a pointing mouse 2206, and the like. The reliability of the display portion 2203 or other mounted semiconductor devices is enhanced in the computer of the present invention. FIG. 6C shows a laptop computer as an example, but the present invention can be applied to a desktop computer in which a hard disc and a display portion are united, and the like.

FIG. 6D shows a mobile computer including a main body 2301, a display portion 2302, a switch 2303, operation keys 2304, an infrared port 2305 and the like. The reliability of the display portion 2302 or other mounted semiconductor devices is enhanced in the mobile computer of the present invention.

FIG. 6E shows a portable game machine including a casing 2401, a display portion 2402, a speaker portion 2403, operation keys 2404, a port for inserting a recording medium 2405 and the like. The reliability of the display portion 2402 or other mounted semiconductor devices is enhanced in the portable game machine of the present invention As described above, the present invention can be applied extremely widely and used for electronics of all fields. This application is based on Japanese Patent Application serial no. 2003-189045 filed in Japan Patent Office on 30 Jun. 2003, the contents of which are hereby incorporated by reference.

Although the present invention has been fully described by way of Embodiment Modes with reference to the accompanying drawings, it is to be understood that various changes and modifications will be apparent to those skilled in the art. Therefore, unless such changes and modifications depart from the scope of the present invention hereinafter defined, they should be constructed as being included therein.

What is claimed is:

1. A light emitting display device comprising:
   a thin film transistor formed over a substrate;
   a light-emitting formed over the thin film transistor and connected to the thin film transistor;
   an auxiliary wiring over the light-emitting element; and
   a passivation film comprising silicon nitride formed over the auxiliary wiring,
   wherein the passivation film contains a rare gas element at a concentration of 0.3 atomic % or more,
   wherein the passivation film contains hydrogen at a concentration of less than 25 atomic %, and
   wherein an etching rate of the passivation film on a buffered hydrogen fluoride including HF of 4.7% and $NH_4F$ of 36.3% at room temperature is 30.0 nm/min or less.

2. A light-emitting display device according to claim 1, wherein the rare gas is any one of helium (He), neon (Ne), argon (Ar), krypton (Kr), and xenon (Xe).

3. A light-emitting display device according to claim 1, wherein an etching rate of the passivation film is 20.0 nm/min or less.

4. An electronic device having light-emitting display device according to claim 1.

5. A cellular phone having the having light-emitting device according to claim 1.

6. A digital camera having the light-emitting display device according to claim 1.

7. A mobile computer having the light-emitting display device according to claim 1.

8. A light emitting display device comprising:
a thin film transistor formed over a substrate;
a light emitting element formed over the thin film transistor and connected to the thin film transistor; and
a passivation film comprising silicon nitride formed over the light emitting element,
wherein the passivation film contains a rare gas element at a concentration of 03 atomic % or more; and
wherein the passivation film contains hydrogen at a concentration of less than 25 atomic %,
wherein an etching rate of the passivation film on a buffered hydrogen fluoride including HF of 4.7 and $NH_4F$ of 36.3 at room temperature is 30.0 nm/min or less.

9. A light-emitting display device according to claim 8, wherein the rare gas is any one of helium (he), neon (Ne), argon (Ar), krypton (Kr), and xenon (Xe).

10. A light-emitting display device according to claim 8, wherein an etching rate of the passivation film is 20.0 nm/min or less.

11. An electronic device having the light-emitting display device according to claim 8.

12. A cellular phone having the light-emitting device according to claim 8.

13. A digital camera having the light-emitting display device according to claim 8.

14. A mobile computer having the light-emitting display device according to claim 8.

15. A light emitting display device comprising:
a thin film transistor formed over a substrate;
a light-emitting element formed over the thin film transistor and connected to the thin film transistor;
an auxiliary wiring over the light-emitting element; and
a passivation film comprising silicon nitride formed over the auxiliary wiring,
wherein the passivation film contains a rare gas element at a concentration of 0.3 atomic % or more;
wherein the passivation film contains oxygen at a concentration of 4.0 atomic % or more;
wherein the passivation film contains hydrogen at a concentration of less than 25 atomic %, and
wherein an etching rate of the passivation film on a buffered hydrogen fluoride including HF of 4.7% and $NH_4F$ of 36.3% at room temperature is 30.0 nm/min or less.

16. A light-emitting display device according to claim 15, wherein the rare gas is any one of helium (He), neon (Ne), argon (Ar), krypton (Kr), and xenon (Xe).

17. A light-emitting display device according to claim 15, wherein an etching rate of the passivation film is 20.0 nm/min or less.

18. An electronic device having the lighting-emitting display device according to claim 15.

19. A cellular phone having the light-emitting device according to claim 15.

20. A digital camera having the light-emitting display device according to claim 15.

21. A mobile computer having the light-emitting display device according to claim 15.

22. A light emitting display device comprising:
a thin film transistor formed over a substrate;
a light-emitting element formed over the thin film transistor and connected to the thin film transistor; and
a passivation film comprising silicon nitride formed over the light emitting element,
wherein the passivation film contains a rare gas element at a concentration of 0.3 atomic % or more;
wherein the passivation film contains oxygen at a concentration of 4.0 atomic % or more;
wherein the passivation film contains hydrogen at a concentration of less than 25 atomic %; and
wherein an etching rate of the passivation film on a buffered hydrogen fluoride including HF of 4.7 and $NH_4F$ of 36.3 at room temperature is 30.0 nm/min or less.

23. A light-emitting display device according to claim 22, wherein the rare gas is any one of helium (He), neon (Ne), argon (Ar), krypton (Kr), and xenon (Xe).

24. A light-emitting display device according to claim 22, wherein an etching rate of the passivation film is 20.0 nm/min or less.

25. An electronic device having light-emitting display device according claim 22.

26. A cellular phone having the light-emitting device according to claim 22.

27. A digital camera having the light-emitting display device according to claim 22.

28. A mobile computer having the light-emitting display device according to claim 22.

* * * * *